United States Patent
Hashimoto et al.

(10) Patent No.: US 12,424,441 B2
(45) Date of Patent: Sep. 23, 2025

(54) CHEMICAL-RESISTANT PROTECTIVE FILM

(71) Applicant: NISSAN CHEMICAL CORPORATION, Tokyo (JP)

(72) Inventors: Yuto Hashimoto, Toyama (JP); Tokio Nishita, Toyama (JP); Yuki Endo, Toyama (JP)

(73) Assignee: NISSAN CHEMICAL CORPORATION, Tokyo (JP)

( * ) Notice: Subject to any disclaimer, the term of this patent is extended or adjusted under 35 U.S.C. 154(b) by 565 days.

(21) Appl. No.: 17/908,167

(22) PCT Filed: Mar. 29, 2021

(86) PCT No.: PCT/JP2021/013164
§ 371 (c)(1),
(2) Date: Aug. 30, 2022

(87) PCT Pub. No.: WO2021/200769
PCT Pub. Date: Oct. 7, 2021

(65) Prior Publication Data
US 2023/0114358 A1    Apr. 13, 2023

(30) Foreign Application Priority Data
Mar. 30, 2020 (JP) ................. 2020-060092

(51) Int. Cl.
*H01L 21/027* (2006.01)
*C09D 163/04* (2006.01)
*G03F 7/09* (2006.01)

(52) U.S. Cl.
CPC ........ *H01L 21/0271* (2013.01); *C09D 163/04* (2013.01); *G03F 7/094* (2013.01)

(58) Field of Classification Search
CPC ....... C09D 163/00–10; G03F 7/09–115; H01L 21/0271
See application file for complete search history.

(56) References Cited

U.S. PATENT DOCUMENTS

| | | | |
|---|---|---|---|
| 2006/0234158 A1* | 10/2006 | Hatakeyama | G03F 7/094 430/313 |
| 2009/0087799 A1 | 4/2009 | Tachibana et al. | |
| 2016/0284559 A1 | 9/2016 | Kikuchi et al. | |
| 2017/0153547 A1 | 6/2017 | Sim et al. | |
| 2020/0131376 A1 | 4/2020 | Tokunaga et al. | |
| 2020/0183282 A1 | 6/2020 | Hashimoto et al. | |

FOREIGN PATENT DOCUMENTS

| | | |
|---|---|---|
| JP | 2008-026600 A | 2/2008 |
| JP | 2008-039811 A | 2/2008 |
| JP | 2009-098639 A | 5/2009 |
| TW | 200710579 A | 3/2007 |
| TW | 201700515 A | 1/2017 |
| TW | 201721288 A | 6/2017 |
| WO | 2018/052130 A1 | 3/2018 |
| WO | 2018/203464 A1 | 11/2018 |

OTHER PUBLICATIONS

Apr. 29, Office Action issued in Taiwanese Patent Application No. 110111303.
Jun. 8, 2021 International Search Report issued in International Patent Application No. PCT/JP2021/013164.
Jun. 8, 2021 Written Opinion issued in International Patent Application No. PCT/JP2021/013164.

* cited by examiner

*Primary Examiner* — Daniel P Shook
(74) *Attorney, Agent, or Firm* — Oliff PLC

(57) ABSTRACT

A protective film-forming composition excelling in preservation stability and having a favorable masking (protection) function against wet etching solutions when processing a semiconductor substrate, a protective film manufactured by using the composition, a substrate with a resist pattern, and a method for manufacturing a semiconductor device. The protective film-forming composition provides protection against wet etching solutions for semiconductors and contains: a polymer having a unit structure represented by Formula (1-1): Ar represents a benzene ring, a naphthalene ring, or an anthracene ring; $R^1$ represents a hydroxy group, a mercapto group; n1 represents an integer from 0-3; n2 represents 1 or 2; $L^1$ represents a single bond or an alkylene group that has 1-10 carbons; E represents an epoxy group; when n2=1, $T^1$ represents an alkylene group that has 1-10 carbons; and when n2=2, $T^1$ represents a nitrogen atom or an amide bond.

Formula (1-1)

$$\left(\begin{array}{c}(E)_{n2}\\|\\T^1\\|\\Ar\\|\\(R^1)_{n1}\end{array}\right)\!-\!L^1\!-$$

8 Claims, No Drawings

CHEMICAL-RESISTANT PROTECTIVE FILM

TECHNICAL FIELD

The present invention relates to a composition for forming a protective film having an excellent resistance particularly to a wet etching liquid for semiconductor, in a lithography process in the production of a semiconductor. In addition, the present invention relates to a method for producing a substrate having a resist pattern, to which the protective film is applied, and a method for producing a semiconductor device.

BACKGROUND ART

In the production of a semiconductor has been widely known a lithography process, in which a resist underlayer film is formed between a substrate and a resist film formed on the substrate, and forming a resist pattern having a desired form. After the resist pattern has been formed, the substrate is processed. Here, dry etching is mainly used in this process; however, wet etching may be used depending on the type of the substrate. Patent Literatures 1 and 2 disclose a protective film-forming composition to an aqueous hydrogen peroxide solution, comprising a specific compound.

CITATION LIST

Patent Literatures

Patent Literature 1: WO 2018/052130 A1
Patent Literature 2: WO 2018/203464 A1

SUMMARY OF INVENTION

Technical Problem

In the case where a resist underlayer film is used as an etching mask and a base substrate is processed by wet etching, the resist underlayer film is required to have a good masking function (i.e., the masked part can protect the substrate) with respect to the wet etching liquid used at the time of processing the base substrate. In such case, the resist underlayer film is used as a protective film of a substrate.

Conventionally, a technique of selecting a low-molecular weight compound (e.g., gallic acid) as an additive has been used for exhibiting a resistance to SC-1 (ammonia-hydrogen peroxide solution), which is one of wet etching chemical liquids. However, the technique still has limited efficiency in solving the above-mentioned problem.

An object of the present invention is to solve the above-mentioned problems.

Solution to Problem

[1]
The present invention includes the followings.

A protective film-forming composition to a wet etching liquid for semiconductor, comprising a polymer having a unit structure represented by formula (1-1):

[Chemical Formula 1]

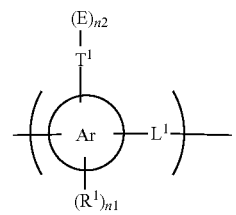

Formula (1-1)

(wherein, Ar represents a benzene ring, a naphthalene ring or anthracene ring; $R^1$ represents a hydroxy group, a mercapto group which may be protected by a methyl group, an amino group which may be protected by a methyl group, a halogeno group or an alkyl group having 1 to 10 carbon atoms which may be substituted or interrupted by a heteroatom or substituted by a hydroxy group; n1 represents an integer of 0 to 3; n2 represents 1 or 2; $L^1$ represents a single bond or an alkylene group of 1 to 10 carbon atoms; E represents an epoxy group; when n2=1, $T^1$ represents a single bond or an alkylene group of 1 to 10 carbon atoms which may be interrupted by an ether bond, ester bond or amide bond; and when n2=2, $T^1$ represents a nitrogen atom or amide bond),
a thermal polymerization initiator, and
a solvent.

[2]
The protective film-forming composition to a wet etching liquid for semiconductor according to [1], wherein the $L^1$ is represented by formula (1-2):

[Chemical Formula 2]

$$—CR^2R^3—$$ Formula (1-2)

(wherein, each of $R^2$ and $R^3$ independently represents a hydrogen atom, a methyl group, an ethyl group, an n-propyl group, an i-propyl group, a cyclopropyl group, an n-butyl group, an i-butyl group, an s-butyl group, a t-butyl group, a cyclobutyl group, and $R^2$ and $R^3$ bind to each other to form a ring of 3 to 6 carbon atoms).

[3]
The protective film-forming composition to a wet etching liquid for semiconductor according to [1], wherein the thermal polymerization initiator is a thermal cationic polymerization initiator.

[4]
The protective film-forming composition to a wet etching liquid for semiconductor according to [3], wherein the thermal cationic polymerization initiator is an onium salt compound.

[5]
The protective film-forming composition to a wet etching liquid for semiconductor according to any one of [1] to [4], wherein the wet etching liquid for semiconductor comprises a hydrogen peroxide solution.

[6]
A protective film to a wet etching liquid for semiconductor, which is a baked product of an applied film of the protective film-forming composition according to any one of [1] to [5].

[7]

A method for producing a substrate having a resist pattern comprising the steps of:
applying the protective film-forming composition according to any one of [1] to [5] onto a semiconductor substrate and baking the applied composition to form a protective film as a resist underlying film,
forming a resist film on the protective film, followed by exposure and development to form a resist pattern,
wherein the substrate having a resist pattern is for manufacturing a semiconductor.

[8]

A method for producing a semiconductor device comprising the steps of:
forming a protective film on a semiconductor substrate optionally having an inorganic film formed on a surface thereof using the protective film-forming composition according to any one of [1] to [5];
forming a resist pattern on the protective film;
subjecting the protective film to dry etching using the resist pattern as a mask so as to expose a surface of the inorganic film or of the semiconductor substrate; and
while using the dry-etched protective film as a mask, subjecting the inorganic film or the semiconductor substrate to wet etching and/or to washing using a wet etching liquid for semiconductor.

Advantageous Effects of Invention

The protective film-forming composition of the present invention, in a lithography process in the production of a semiconductor, facilitates microfabrication of a semiconductor substrate by its good masking function to a wet etching liquid used during the processing of the base substrate.

DESCRIPTION OF EMBODIMENTS

[Protective Film-Forming Composition]

The protective film-forming composition to a wet etching liquid for semiconductor of the present application comprises
a polymer having a unit structure represented by formula (1-1):

[Chemical Formula 3]

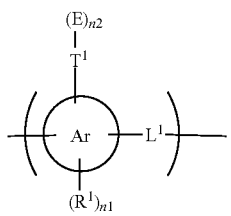

Formula (1-1)

(wherein, Ar represents a benzene ring, a naphthalene ring or anthracene ring; $R^1$ represents, as a substituent of a hydrogen atom of the benzene ring, naphthalene ring, or anthracene ring, a hydroxy group, a mercapto group which may be protected by a methyl group, an amino group which may be protected by methyl group, a halogeno group or an alkyl group having 1 to 10 carbon atoms which may be substituted or interrupted by a heteroatom or substituted by a hydroxy group; n1 represents an integer of 0 to 3; n2 represents 1 or 2; $L^1$ represents a single bond or an alkylene group of 1 to 10 carbon atoms; E represents an epoxy group; when n2=1, $T^1$ represents a single bond or an alkylene group of 1 to 10 carbon atoms which may be interrupted by an ether bond, ester bond or amide bond; and when n2=2, $T^1$ represents a nitrogen atom or amide bond),
a thermal polymerization initiator, and
a solvent.

$R^1$ may be an alkoxy group of 1 to 10 carbon atoms.

Examples of alkoxy groups having 1 to 10 carbon atoms include a methoxy group, an ethoxy group, an n-propoxy group, an i-propoxy group, an n-butoxy group, an i-butoxy group, an s-butoxy group, a t-butoxy group, an n-pentoxy group, a 1-methyl-n-butoxy group, a 2-methyl-n-butoxy group, a 3-methyl-n-butoxy group, a 1,1-dimethyl-n-propoxy group, a 1,2-dimethyl-n-propoxy group, a 2,2-dimethyl-n-propoxy group, a 1-ethyl-n-propoxy group, an n-hexyloxy group, a 1-methyl-n-pentyloxy group, a 2-methyl-n-pentyloxy group, a 3-methyl-n-pentyloxy group, a 4-methyl-n-pentyloxy group, a 1,1-dimethyl-n-butoxy group, a 1,2-dimethyl-n-butoxy group, a 1,3-dimethyl-n-butoxy group, a 2,2-dimethyl-n-butoxy group, a 2,3-dimethyl-n-butoxy group, a 3,3-dimethyl-n-butoxy group, a 1-ethyl-n-butoxy group, a 2-ethyl-n-butoxy group, a 1,1,2-trimethyl-n-propoxy group, a 1,2,2,-trimethyl-n-propoxy group, 1-ethyl-1-methyl-n-propoxy group, 1-ethyl-2-methyl-n-propoxy group, an n-heptyloxy group, an n-octyloxy group, and an n-nonyloxy group.

The unit structure represented by the above-mentioned formula (1-1) may be used alone or in combination of two or more. For example, it may be a copolymer having more than one unit structure where Ar is of the same type, but it does not exclude such a copolymer having more than one unit structure where Ar is of different type, such as a copolymer having a unit structure in which Ar comprises a benzene ring and a unit structure having a naphthalene ring, for example, from the technical scope of the present application, either.

The above-mentioned "may be interrupted" refers to the fact that, in the case of an alkylene group having 2 to 10 carbon atoms, any atom between carbon-carbon atoms within the alkylene group is interrupted by a heteroatom (i.e., in case of oxygen, an ether bond, and in case of sulfur, a sulfide bond), an ester bond, or an amide bond, and in case of an alkylene group having one carbon atom (i.e., methylene group), the term refers to the fact that either one side of the carbon atom of the methylene group has a heteroatom (i.e., in case of oxygen, an ether bond, and in case of sulfur, a sulfide bond), an ester bond, or an amide bond.

When n2=1, the above-mentioned $T^1$ represents a single bond, or an alkylene group having 1 to 10 carbon atoms which may be interrupted by an ether bond, ester bond or amide bond. It is preferred to be a combination of an ether bond and a methylene group (i.e., as in the case where the "-T1-(E)n2" of formula (1-1) is a glycidyl ether group), a combination of an ester bond and a methylene group, or a combination of an amide bond and a methylene group.

An alkyl group having 1 to 10 carbon atoms that may be substituted with a heteroatom refers to one or more hydrogen atoms of the above-mentioned alkyl group having 1 to 10 carbon atoms being substituted with a heteroatom (preferably a halogeno group).

Examples of the alkyl groups having 1 to 10 carbon atoms include a methyl group, an ethyl group, an n-propyl group, an i-propyl group, a cyclopropyl group, an n-butyl group, an i-butyl group, an s-butyl group, a t-butyl group, a cyclobutyl group, a 1-methyl-cyclopropyl group, a 2-methyl-cyclopropyl group, an n-pentyl group, a 1-methyl-n-butyl group, a 2-methyl-n-butyl group, a 3-methyl-n-butyl group, a 1,1-dimethyl-n-propyl group, a 1,2-dimethyl-n-propyl group, a 2,2-dimethyl-n-propyl group, a 1-ethyl-n-propyl group, a cyclopentyl group, a 1-methyl-cyclobutyl group, a 2-methyl-cyclobutyl group, a 3-methyl-cyclobutyl group, a 1,2-dimethyl-cyclopropyl group, a 2,3-dimethyl-cyclopropyl group, a 1-ethyl-cyclopropyl group, a 2-ethyl-cyclopropyl group, an n-hexyl group, a 1-methyl-n-pentyl group, a 2-methyl-n-pentyl group, a 3-methyl-n-pentyl group, a 4-methyl-n-pentyl group, a 1,1-dimethyl-n-butyl group, a 1,2-dimethyl-n-butyl group, a 1,3-dimethyl-n-butyl group, a 2,2-dimethyl-n-butyl group, a 2,3-dimethyl-n-butyl group, a 3,3-dimethyl-n-butyl group, a 1-ethyl-n-butyl group, a 2-ethyl-n-butyl group, a 1,1,2-trimethyl-n-propyl group, a 1,2,2-trimethyl-n-propyl group, a 1-ethyl-1-methyl-n-propyl group, a 1-ethyl-2-methyl-n-propyl group, a cyclohexyl group, a 1-methyl-cyclopentyl group, a 2-methyl-cyclopentyl group, a 3-methyl-cyclopentyl group, a 1-ethyl-cyclobutyl group, a 2-ethyl-cyclobutyl group, a 3-ethyl-cyclobutyl group, a 1,2-dimethyl-cyclobutyl group, a 1,3-dimethyl-cyclobutyl group, a 2,2-dimethyl-cyclobutyl group, a 2,3-dimethyl-cyclobutyl group, a 2,4-dimethyl-cyclobutyl group, a 3,3-dimethyl-cyclobutyl group, a 1-n-propyl-cyclopropyl group, a 2-n-propyl-cyclopropyl group, a 1-i-propyl-cyclopropyl group, a 2-i-propyl-cyclopropyl group, a 1,2,2-trimethyl-cyclopropyl group, a 1,2,3-trimethyl-cyclopropyl group, a 2,2,3-trimethyl-Cyclopropyl group, a 1-ethyl-2-methyl-cyclopropyl group, a 2-ethyl-1-methyl-cyclopropyl group, a 2-ethyl-2-methyl-cyclopropyl group, and a 2-ethyl-3-methyl-cyclopropyl group, a decyl group, a methoxy group, an ethoxy group, a methoxymethyl group, an ethoxymethyl group, a methoxyethyl group, an ethoxyethyl group, a hydroxymethyl group, a 1-hydroxyethyl group, a 2-hydroxyethyl group, a methylamino group, a dimethylamino group, a diethylamino group, an aminomethyl group, a 1-aminoethyl group, a 2-aminoethyl group, a methylthio group, an ethylthio group, a mercaptomethyl group, a 1-mercaptoethyl group, and a 2-mercaptoethyl group.

Examples of alkylene groups having 1 to 10 carbon atoms include a methylene group, an ethylene group, an n-propylene group, an isopropylene group, a cyclopropylene group, an n-butylene group, an isobutylene group, an s-butylene group, a t-butylene group, a cyclobutylene group, a 1-methyl-cyclopropylene group, a 2-methyl-cyclopropylene group, an n-pentylene group, a 1-methyl-n-butylene group, a 2-methyl-n-butylene group, a 3-methyl-n-butylene group, a 1,1-dimethyl-n-propylene group, a 1,2-dimethyl-n-propylene group, a 2,2-dimethyl-n-propylene group, a 1-ethyl-n-propylene group, a cyclopentylene group, a 1-methyl-cyclobutylene group, a 2-methyl-cyclobutylene group, a 3-methyl-cyclobutylene group, a 1,2-dimethyl-cyclopropylene group, a 2,3-dimethyl-cyclopropylene group, a 1-ethyl-cyclopropylene group, a 2-ethyl-cyclopropylene group, an n-hexylene group, a 1-methyl-n-pentylene group, a 2-methyl-n-pentylene group, a 3-methyl-n-pentylene group, a 4-methyl-n-pentylene group, a 1,1-dimethyl-n-butylene group, a 1,2-dimethyl-n-butylene group, a 1,3-dimethyl-n-butylene group, a 2,2-dimethyl-n-butylene group, a 2,3-dimethyl-n-butylene group, a 3,3-dimethyl-n-butylene group, a 1-ethyl-n-butylene group, a 2-ethyl-n-butylene group, a 1,1,2-trimethyl-n-propylene group, a 1,2,2-trimethyl-n-propylene group, a 1-ethyl-1-methyl-n-propylene group, a 1-ethyl-2-methyl-n-propylene group, a cyclohexylene group, a 1-methyl-cyclopentylene group, a 2-methyl-cyclopentylene group, a 3-methyl-cyclopentylene group, a 1-ethyl-cyclobutylene group, a 2-ethyl-cyclobutylene group, a 3-ethyl-cyclobutylene group, a 1,2-dimethyl-cyclobutylene group, a 1,3-dimethyl-cyclobutylene group, a 2,2-dimethyl-cyclobutylene group, a 2,3-dimethyl-cyclobutylene group, a 2,4-dimethyl-cyclobutylene group, a 3,3-dimethyl-cyclobutylene group, a 1-n-propyl-cyclopropylene group, a 2-n-propyl-cyclopropylene group, a 1-isopropyl-cyclopropylene group, a 2-isopropyl-cyclopropylene group, a 1,2,2-trimethyl-cyclopropylene group, a 1,2,3-trimethyl-cyclopropylene group, a 2,2,3-trimethyl-cyclopropylene group, a 1-ethyl-2-methyl-cyclopropylene group, a 2-ethyl-1-methyl-cyclopropylene group, a 2-ethyl-2-methyl-cyclopropylene group, a 2-ethyl-3-methyl-cyclopropylene group, an n-heptylene group, an-octylene group, an n-nonylene group, or an n-decanylene group.

$L^1$ represents a single bond or an alkylene group having 1 to 10 carbon atoms and is preferred to be represented by formula (1-2):

[Chemical Formula 4]

$$—CR^2R^3— \qquad \text{Formula (1-2)}$$

(wherein, each of $R^2$ and $R^3$ independently represents a hydrogen atom, a methyl group, an ethyl group, an n-propyl group, an i-propyl group, a cyclopropyl group, an n-butyl group, an i-butyl group, an s-butyl group, a t-butyl group, a cyclobutyl group; and $R^2$ and $R^3$ bind to each other to form a ring of 3 to 6 carbon atoms). Of these, it is preferred that each of $R^2$ and $R^3$ is a hydrogen atom (i.e., $—(CR^2R^3)—$ is a methylene group).

A halogeno group refers to halogen-X (F, Cl, Br, I) that substitutes hydrogen.

The polymers are not particularly limited as long as they satisfy the unit structure of the above-mentioned formula (1). It may be manufactured by any known method. Commercially available products may be used. Commercially available products include heat-resistant epoxy novolac resin EOCN (registered trademark) series (manufactured by Nippon Kayaku Co., Ltd.), Epoxy novolac resin D.E.N (registered trademark) series (manufactured by Dow Chemical Japan Ltd.), and the like.

The weight average molecular weight of the polymers is 100 or more, within the range of 500 to 200.000, 600 to 50,000, or 700 to 10,000.

The polymer of the present application include the polymers having the following unit structure:

[Chemical Formula 5]

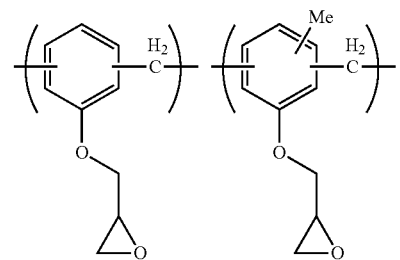

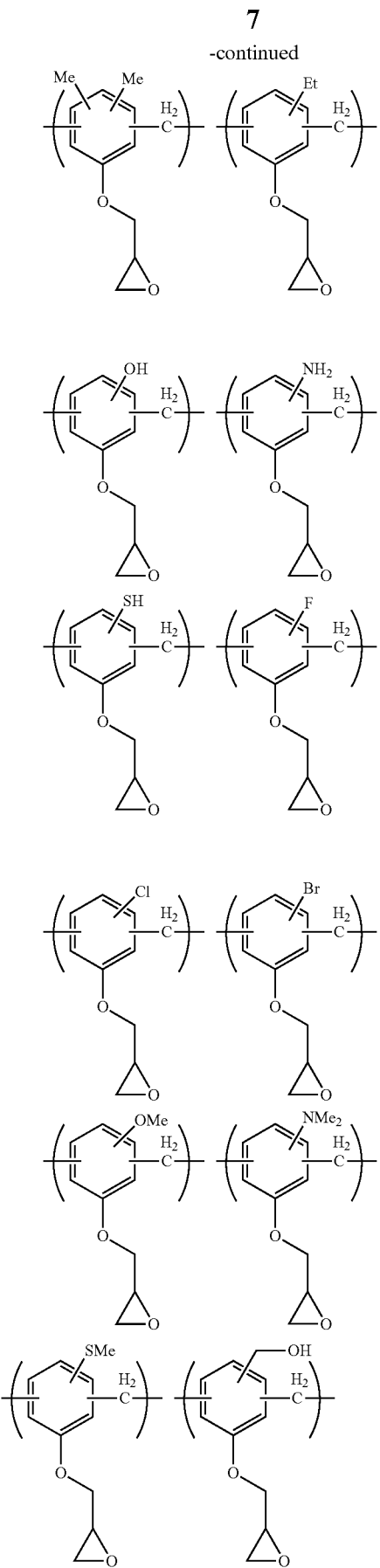

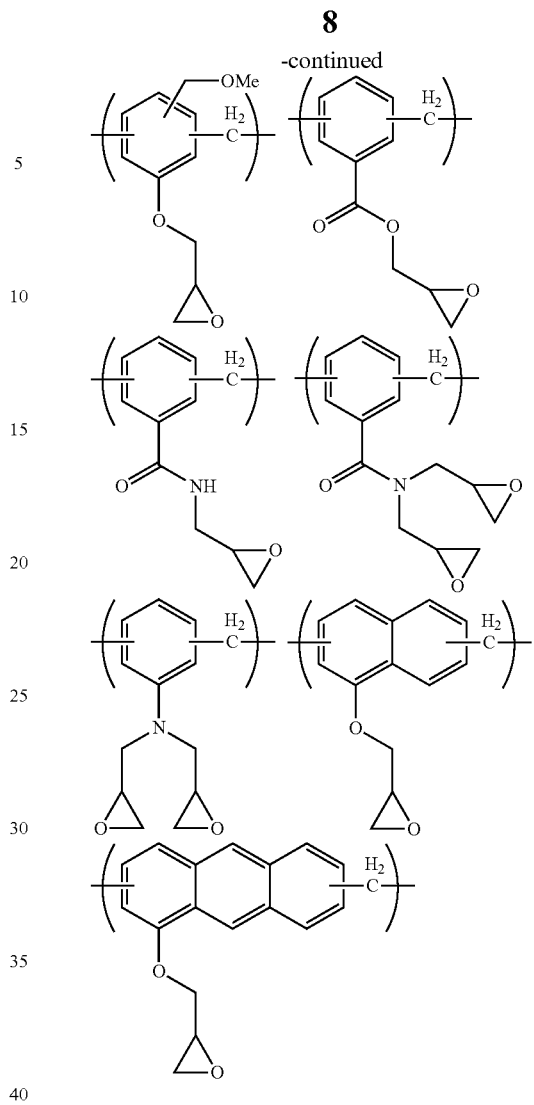

<Thermal Polymerization Initiator>

Unlike the so-called photopolymerization initiator, the thermal polymerization initiator of the present application refers to a compound, which provides an acid predominantly by heating (for example, 50° C. to 300° C.) than by light irradiation. The thermal polymerization initiator of the present application is preferably a thermal cationic polymerization initiator. Specific examples thereof include sulfonic acid compounds and carboxylic acid compounds, such as pyridinium p-toluene sulfonate, pyridinium p-hydroxybenzenesulfonate, pyridinium trifluoromethanesulfonate, p-toluenesulfonic acid, p-hydroxy benzenesulfonic acid, trifluoromethanesulfonic acid, salicylic acid, camphorsulfonic acid, 5-sulfosalicylic acid, chlorobenzenesulfonic acid, methyl 4-phenolsulfonate, benzenesulfonic acid, naphthalene sulfonic acid, citric acid, benzoic acid; quaternary ammonium salts of trifluoromethanesulfonic acid K-PURE [registered trademark] TAG2689, TAG2690, TAG2678, CXC-1614, and the like (each of which is manufactured by King Industries, Inc.), 2,4,4,6-tetrabromocyclohexadienone, benzoin tosylate, 2-nitrobenzyl tosylate, aromatic sulfonium salts, such as SAN-AID [registered trademark] SI series (SI-45, SI-60, SI-80, SI-100, SI-110, SI-150, and the like) (manufactured by Sanshin Chemical Industry Co., Ltd.), and other organic alkyl sulfonate esters.

Of these, onium salt compounds are preferred, quaternary ammonium salt-containing compounds are preferred, and quaternary ammonium salts of trifluoromethanesulfonic acid are preferred. These thermal polymerization initiators may be used each alone or in combination of two or more.

The content of the protective film-forming composition of the thermal acid generator ranges from 0.0001 to 20% by weight, preferably 0.01 to 15% by weight, further preferably 0.1 to 10% by mass, based on the total solid content of the protective film-forming composition.

[Solvent]

The protective film-forming composition of the present invention may be prepared by dissolving each of the above-mentioned components in a solvent, more preferably, in an organic solvent, and the composition is used in a uniform solution state.

With respect to the solvent for the protective film-forming composition of the present invention, there is no particular limitation for the use as long as the solvents can dissolve the solid components at room temperature contained in the protective film-forming composition of the present invention. Particularly, the protective film-forming composition of the present invention is used in a uniform solution state, and therefore, taking the application properties of the composition into consideration, it is recommended that a solvent generally used in a lithography process be used in combination.

Examples of the organic solvent include ethylene glycol monomethyl ether, ethylene glycol monoethyl ether, methyl cellosolve acetate, ethyl cellosolve acetate, diethylene glycol monomethyl ether, diethylene glycol monoethyl ether, propylene glycol, propylene glycol monomethyl ether, propylene glycol monoethyl ether, propylene glycol monomethyl ether acetate, propylene glycol propyl ether acetate, toluene, xylene, methyl ethyl ketone, methyl isobutyl ketone, cyclopentanone, cyclohexanone, cycloheptanone, 4-methyl-2-pentanol, methyl 2-hydroxyisobutyrate, ethyl 2-hydroxyisobutyrate, ethyl ethoxyacetate, 2-hydroxyethyl acetate, methyl 3-methoxypropionate, ethyl 3-methoxypropionate, ethyl 3-ethoxypropionate, methyl 3-ethoxypropionate, methyl pyruvate, ethyl pyruvate, ethyl acetate, butyl acetate, ethyl lactate, butyl lactate, 2-heptanone, methoxycyclopentane, anisole, γ-butyrolactone, N-methylpyrrolidone, N,N-dimethylformamide, and N,N-dimethylacetamide. These solvents may be used each alone or in combination of two kinds or more.

Of these solvents, preferred are propylene glycol monomethyl ether, propylene glycol monomethyl ether acetate, ethyl lactate, butyl lactate, and cyclohexanone. Especially preferred are propylene glycol monomethyl ether and propylene glycol monomethyl ether acetate.

<Cross-Linking Agent>

The protective film-forming composition of the present invention may contain a cross-linking agent component. Examples of the cross-linking agent include cross-linking agents of a class of melamine, substituted urea, or polymer thereof. Preferred is a cross-linking agent having at least two cross-linking forming substituents, and examples include compounds, such as methoxymethylated glycoluril, butoxymethylated glycoluril, methoxymethylated melamine, butoxymethylated melamine, methoxymethylated benzoguanamine, butoxymethylated benzoguanamine, methoxymethylated urea, butoxymethylated urea, methoxymethylated thiourea, and methoxymethylated thiourea. Further, a condensation product of these compounds may be used.

As the cross-linking agent, a cross-linking agent having a high heat resistance may be used. With respect to the cross-linking agent having a high heat resistance, a compound containing in the molecule thereof, a cross-linking forming substituent having an aromatic ring (for example, a benzene ring or a naphthalene ring), may be used.

Examples of such a compound include compounds having a partial structure of formula (2-1) below, and polymers or oligomers having a repeating unit of formula (2-2) below.

[Chemical Formula 6]

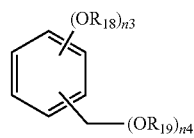

Formula (2-1)

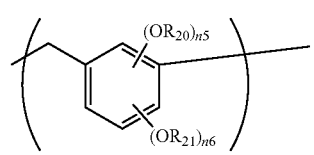

Formula (2-2)

$R_{18}$, $R_{19}$, $R_{20}$, and $R_{21}$ are a hydrogen atom or an alkyl group having 1 to 10 carbon atoms, and the alkyl groups may be as exemplified above.

$n_3$ satisfies $1 \le n_3 \le n_4$, $n_4$ satisfies $1 \le n_4 \le 5$, $n_5$ satisfies $1 \le n_5 \le 4-n_6$, and $n_6$ satisfies $1 \le n_6 \le 3$.b The compound represented by formula (2-1) is exemplified by formulae (2-3) to (2-19).

[Chemical Formula 7]

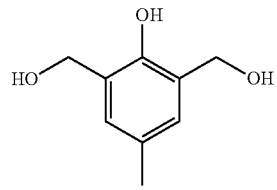

Formula (2-3)

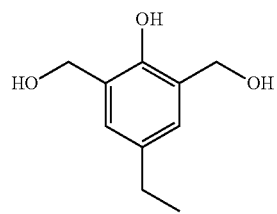

Formula (2-4)

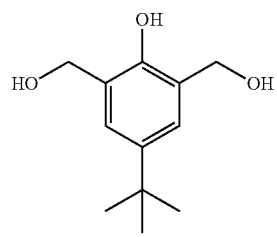

Formula (2-5)

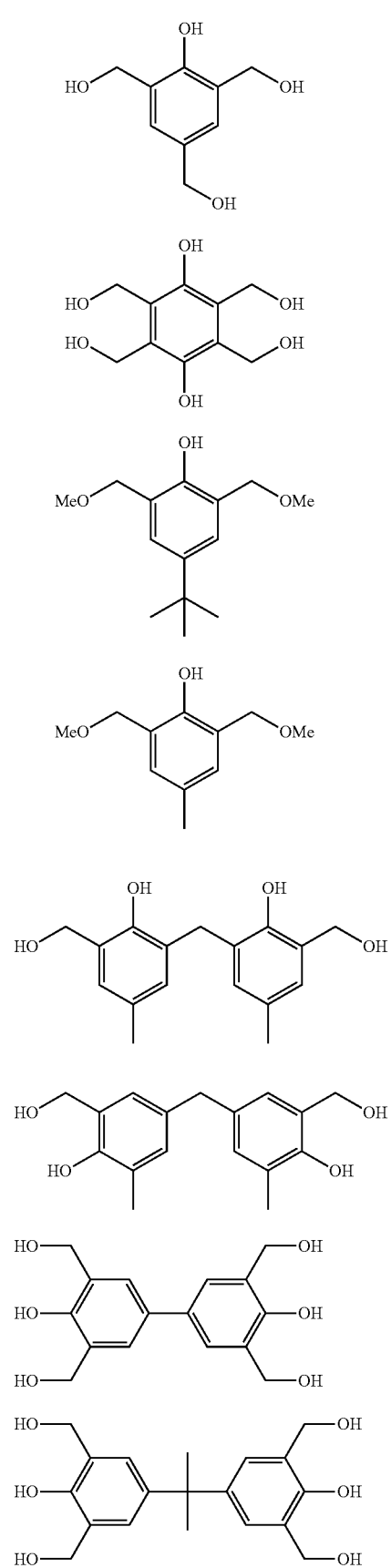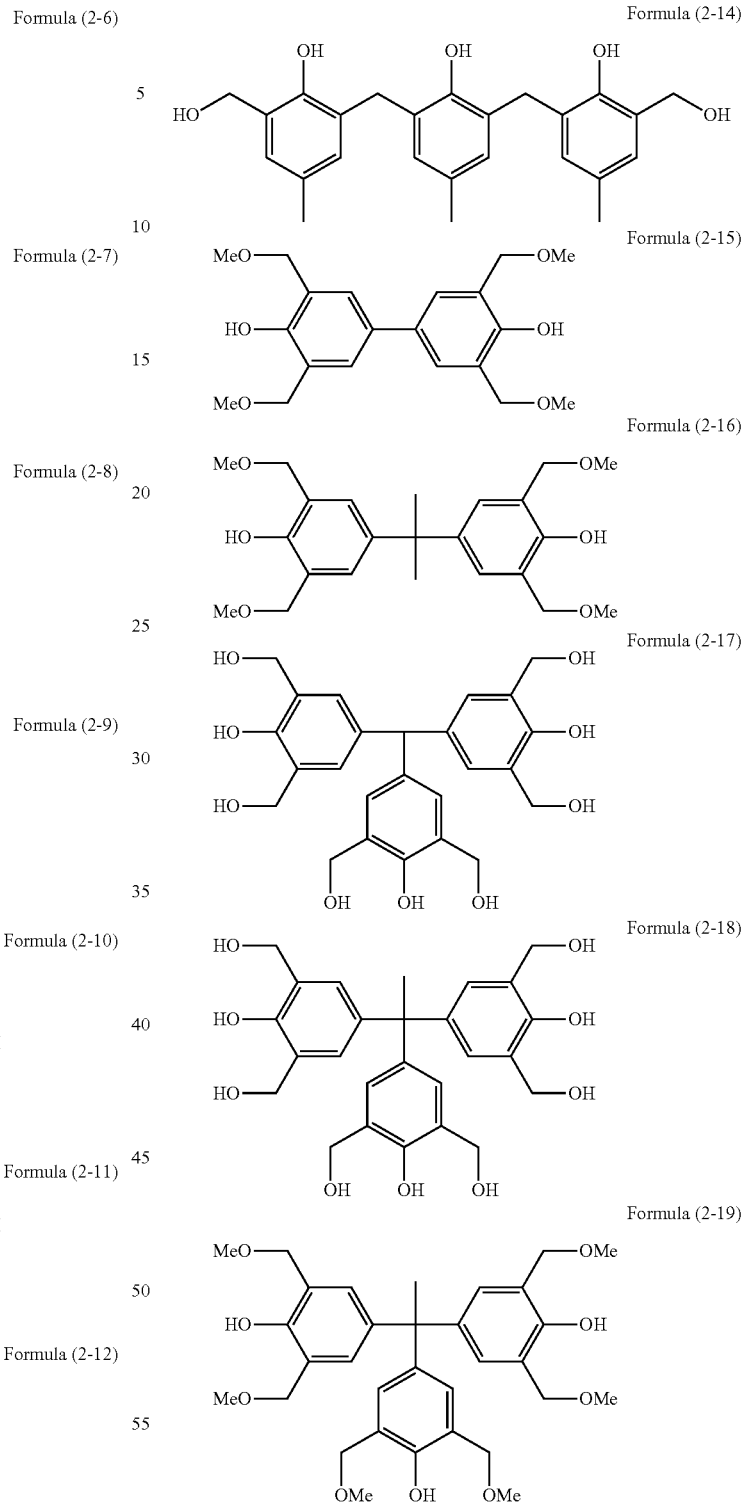

The above-mentioned compounds are available as products of Asahi Yukizai Corporation and Honshu Chemical Industry Co., Ltd. For example, of the above-mentioned cross-linking agents, the compound of formula (2-15) is available under the trade name: TMOM-BP, manufactured by Asahi Yukizai Corporation.

The amount of cross-linking agent added varies depending on the coating solvent used, the base substrate used, the required solution viscosity, the required film shape, and the like. However, it is preferably 0.001 to 80% by weight, preferably 0.01 to 50% by weight, and even more preferably 0.1 to 40% by weight of the total solid content of the protective film-forming composition. These cross-linking agents may cause cross-linking reaction by self-condensation. However, if cross-linkable substituents are present in the above-mentioned polymers of the present invention, the cross-linking agents can cause cross-linking reaction with those cross-linkable substituents.

[Surfactant]

The protective film-forming composition of the present invention may contain, as an optional component, a surfactant for improving the application properties with respect to a semiconductor substrate. Examples of the surfactant include nonionic surfactants, e.g., polyoxyethylene alkyl ethers, such as polyoxyethylene lauryl ether, polyoxyethylene stearyl ether, polyoxyethylene cetyl ether, and polyoxyethylene oleyl ether; polyoxyethylene alkyl aryl ethers, such as polyoxyethylene octyl phenyl ether and polyoxyethylene nonyl phenyl ether; polyoxyethylene-polyoxypropylene block copolymers: sorbitan fatty acid esters, such as sorbitan monolaurate, sorbitan monopalmitate, sorbitan monostearate, sorbitan monooleate, sorbitan trioleate, and sorbitan tristearate; and polyoxyethylene sorbitan fatty acid esters, such as polyoxyethylene sorbitan monolaurate, polyoxyethylene sorbitan monopalmitate, polyoxyethylene sorbitan monostearate, polyoxyethylene sorbitan trioleate, and polyoxyethylene sorbitan tristearate; fluorine surfactants, such as EFTOP [registered trademark] EF301, EFTOP EF303, EFTOP EF352 (manufactured by Mitsubishi Materials Electronic Chemicals Co., Ltd.), MEGAFACE [registered trademark] F171, MEGAFACE F173, MEGAFACE R-30, MEGAFACE R-40, MEGAFACE R-40-LM (manufactured by DIC Corporation), Fluorad FC430, Fluorad FC431 (manufactured by Sumitomo 3M), and AsahiGuard [registered trademark] AG710, Surflon [registered trademark] S-382, Surflon SC101, Surflon SC102, Surflon SC103, Surflon SC104, Surflon SC105, Surflon SC106 (manufactured by Asahi Glass Co., Ltd.), and organosiloxane polymer KP341 (manufactured by Shin-Etsu Chemical Co., Ltd.). These surfactants may be used each alone or in combination of two or more. When the protective film-forming composition contains a surfactant, the amount of the surfactant contained ranges from 0.0001 to 10% by weight, preferably from 0.01 to 5% by weight to the total solid content of the protective film-forming composition.

[Protective Film-Forming Composition]

The protective film-forming composition of the present invention generally has a solid content from 0.1 to 70% by mass, preferably from 0.1 to 60% by mass. The solid content indicates a content ratio of the total component remaining after removing the solvent from the protective film-forming composition. The ratio of the polymer in the solid content is preferably within the range of from 1 to 100% by mass, from 1 to 99.9% by mass, from 50 to 99.9% by mass, from 50 to 95% by mass, and from 50 to 90% by mass, while increasing preference.

[Wet Etching Liquid for Semiconductor]

Further, using the protective film obtained after dry etching (including the resist pattern in the case where the resist pattern remains on the protective film) as a mask, the resultant substrate is subjected to wet etching using a wet etching liquid for semiconductor, forming a desired pattern.

With respect to the wet etching liquid for semiconductor, a general chemical liquid for etch processing a wafer for semiconductor may be used, and, for example, any of a substance exhibiting acidic property and a substance exhibiting basic property may be used.

Examples of substances exhibiting acidic property include hydrogen peroxide, hydrofluoric acid, ammonium fluoride, acidic ammonium fluoride, ammonium hydrogen fluoride, buffered hydrofluoric acid, hydrochloric acid, nitric acid, sulfuric acid, phosphoric acid, and a mixture thereof.

Examples of substances exhibiting basic property include a basic aqueous hydrogen peroxide solution obtained by mixing ammonia, sodium hydroxide, potassium hydroxide, sodium cyanide, potassium cyanide, or an organic amine such as triethanolamine, with a hydrogen peroxide solution so that the pH of the resultant solution becomes basic. A specific example includes SC-1 (ammonia-hydrogen peroxide solution). In addition, the following could be used as a chemical liquid for wet etching: a mixture of a hydrogen peroxide solution and a substance that makes the pH to become basic, for example, urea, so that the heated mixture causes urea to undergo thermal decomposition, generating ammonia, resulting in the pH to eventually become basic.

These chemical liquids may contain an additive, such as a surfactant.

The temperature at which the wet etching liquid for semiconductor is used ranges desirably from 25 to 90° C., further desirably from 40 to 80° C. The wet etching time ranges desirably from 0.5 to 30 minutes, further desirably from 1 to 20 minutes.

[Method for Producing a Protective Film to a Wet Etching Liquid for Semiconductor, a Substrate Having a Resist Pattern, and a Semiconductor Device]

Herein below, a method for producing a substrate having a resist pattern and a method for producing a semiconductor device, using the protective film-forming composition of the present invention, will be described.

The substrate having a resist pattern according to the present invention may be produced by applying the above-described protective film-forming composition onto a semiconductor substrate and baking the applied composition.

Examples of semiconductor substrates to which the protective film-forming composition of the present invention is applied include a silicon wafer, a germanium wafer, and compound semiconductor wafers, such as gallium arsenide, indium phosphide, gallium nitride, indium nitride, and aluminum nitride.

When a semiconductor substrate having an inorganic film formed on the surface thereof is used, the inorganic film is formed by, for example, an ALD (atomic layer deposition) method, a CVD (chemical vapor deposition) method, a reactive sputtering method, an ion plating method, a vacuum deposition method, or a spin coating method (spin on glass: SOG). Examples of the inorganic films include a polysilicon film, a silicon oxide film, a silicon nitride film, a silicon oxynitride film, a BPSG (Boro-Phospho Silicate Glass) film, a titanium nitride film, a titanium nitride oxide film, a tungsten nitride film, a gallium nitride film, and a gallium arsenide film.

The protective film-forming composition of the present invention is applied onto the above-mentioned semiconductor substrate by an appropriate application method, such as a spinner or a coater. Then, the applied composition is baked using a heating means, such as a hotplate, to form a protective film. The conditions for baking are appropriately selected from those at a baking temperature from 100 to 400° C. for a baking time from 0.3 to 60 minutes. Preferred conditions for baking are those at a baking temperature from 120 to 350° C. for a baking time from 0.5 to 30 minutes, and more preferred conditions are those at a baking temperature from 150 to 300° C. for a baking time from 0.8 to 10 minutes. The thickness of the formed protective film ranges, for example, from 0.001 to 10 μm, preferably from 0.002 to 1 μm, more preferably from 0.005 to 0.5 μm (=5 nm to 500 nm), 10 nm to 300 nm, 15 nm to 200 nm, and 30 to 150 nm. When the temperature during the baking is lower than the above range, cross-linking sometimes unsatisfactorily proceeds, making it difficult to obtain a resistance of the formed protective film to a resist solvent or a wet etching liquid. To the contrary, when the temperature at baking stage is higher than the above range, the resultant protective film sometimes undergoes decomposition due to heat.

For the formation of the resist pattern, exposure through a mask (reticle) for forming a predetermined pattern is conducted, and, for example, exposure to an i-line, a KrF excimer laser, an ArF excimer laser, an EUV (extreme ultraviolet light), or an EB (electron beam) lithography is used. In development, an alkaline developer is used, and the conditions are appropriately selected from those at a development temperature from 5 to 50° C. for a development time from 10 to 300 seconds. A usable alkaline developer includes, for example, an aqueous solution of an alkali, e.g., an inorganic alkali, such as sodium hydroxide, potassium hydroxide, sodium carbonate, sodium silicate, sodium metasilicate, or aqueous ammonia, a primary amine, such as ethylamine or n-propylamine; a secondary amine, such as diethylamine or di-n-butylamine; a tertiary amine, such as triethylamine or methyldiethylamine; an alcohol amine, such as dimethylethanolamine or triethanolamine; a quaternary ammonium salt, such as tetramethylammonium hydroxide, tetraethylammonium hydroxide, or choline; or a cyclic amine, such as pyrrole or piperidine. Further, the above-mentioned aqueous alkali solution to which an alcohol, such as isopropyl alcohol, or a surfactant, such as a nonionic surfactant, is added in an appropriate amount, may also be used. Of these, a preferred developer is a quaternary ammonium salt, and further preferred are tetramethylammonium hydroxide and choline. Further, for example, a surfactant may be added to the above developer. A method in which development is conducted using an organic solvent, such as butyl acetate, instead of an alkaline developer, to develop a portion with an unimproved alkali dissolution rate of the photoresist, may be used.

Then, using the formed resist pattern as a mask, the protective film is subjected to dry etching. In this instance, when the above-mentioned inorganic film is formed on the surface of the semiconductor substrate used, the surface of the inorganic film is exposed, and, when the inorganic film is not formed on the surface of the semiconductor substrate used, the surface of the semiconductor substrate is exposed.

EXAMPLES

Hereinbelow, the following Examples and Comparative Examples specifically illustrate the present invention in detail, but the present invention is not limited to these examples.

The apparatus implemented for the measurement of the weight average molecular weight of the compounds used in the below-mentioned Examples is provided below.

Apparatus: HLC-8320GPC, manufactured by Tosoh Corp.
GPC Column: Shodex [registered trademark]-Asahipak [registered trademark] (Showa Denko K.K.)
Column temperature: 40° C.
Solvent: tetrahydrofuran (THF)
Flow rate: 0.6 mL/minute
Standard sample: Polystyrene (Manufactured by Tosoh Corp.)
Meaning of Symbols
PGME: propylene glycol monomethyl ether
PGMEA: propylene glycol monomethyl ether acetate

Example 1

2.00 g of epoxy novolac resin EOCN-104S (product of Nippon Kayaku Co., Ltd., equivalent to formula (1)) (50% by mass PGMEA solution, weight average molecular weight: 3100), 2.08 g of K-PURE [registered trademark] TAG-2689 (product of King Industries, Inc.) as a thermal acid generator (0.5% by mass PGME solution), and 19.23 g of PGMEA and 6.62 g of PGME as solvents, were mixed, and the mixture was made into a 3.5% by mass solution. Then, the solution was filtered with a polytetrafluoroethylene microfilter having a pore diameter of 0.2 μm to prepare a protective film-forming composition.

[Chemical Formula 8]

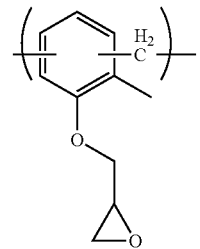

(1)

Example 2

2.08 g of epoxy novolac resin DEN438 (product of Dow Chemical Japan Ltd., equivalent to formula (2)) (50% by mass PGMEA solution, weight average molecular weight: 900), 2.08 g of K-PURE [registered trademark] TAG-2689 (product of King Industries, Inc.) as a thermal acid generator (0.5% by mass PGME solution), and 20.27 g of PGMEA and 5.58 g of PGME as solvents, were mixed, and the mixture was made into a 3.5% by mass solution. Then, the solution was filtered with a polytetrafluoroethylene microfilter having a pore diameter of 0.2 μm to prepare a protective film-forming composition.

[Chemical Formula 9]

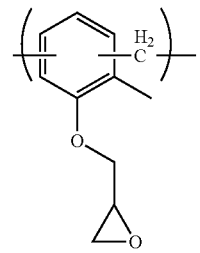

2

Comparative Example 1

10.40 g of Epolead GT401 (product of Daicel Corporation, equivalent to formula (3), weight average molecular weight: 700) (10% by mass PGMEA solution), 2.08 g of K-PURE [registered trademark] TAG-2689 (product of King Industries, Inc.) (0.5% by mass PGME solution) as a thermal acid generator, and 10.91 g of PGMEA and 6.62 g of PGME as solvents, were mixed, and the mixture was made into a 3.5% by mass solution. Then, the solution was filtered with a polytetrafluoroethylene microfilter having a pore diameter of 0.2 μm to prepare a protective film-forming composition.

[Chemical Formula 10]

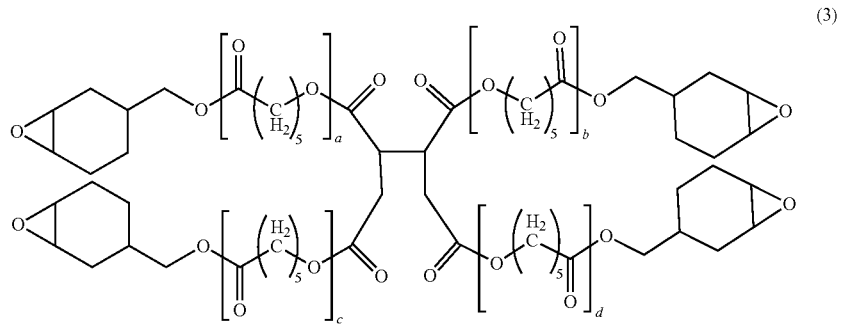

(3)

(a + b + c + d) = 1
a,b,c,d = 0 or 1

Comparative Example 2

2.00 g of epoxy novolac resin EOCN-104S (product of Nippon Kayaku Co., Ltd., equivalent to formula (1)) (50% by mass PGMEA solution, weight average molecular weight: 3100), 0.05 g of triphenylsulfonium trifluoromethanesulfonate (product name TPS105, manufactured by Midori Kagaku Co. Ltd) as a photoacid generator, and 19.27 g of PGMEA and 8.69 g of PGME as solvents, were mixed, and the mixture was made into a 3.5% by mass solution. Then, the solution was filtered with a polytetrafluoroethylene microfilter having a pore diameter of 0.2 μm to prepare a protective film-forming composition.

Comparative Example 3

10.00 g of Epolead GT401 (product of Daicel Corporation, equivalent to formula (3), weight average molecular weight: 700) (10% by mass PGMEA solution), 0.05 g of triphenylsulfonium trifluoromethanesulfonate (product name TPS105, manufactured by Midori Kagaku Co. Ltd) as a photoacid generator and 11.27 g of PGMEA and 8.69 g of PGME as solvents, were mixed, and the mixture was made into a 3.5% by mass solution. Then, the solution was filtered with a polytetrafluoroethylene microfilter having a pore diameter of 0.2 μm to prepare a protective film-forming composition.

[Thermal-Curing Test]

Each of the protective film-forming compositions prepared in Examples 1, 2 and Comparative Examples 1 to 3 was applied onto a silicon wafer using a spinner. The resulting applied film was then baked on a hot plate at 250° C. for 1 minute to form a protective film (film thickness: 90 nm). These protective films were immersed, for 1 minute, in OK73 thinner (manufactured by Tokyo Ohka Kogyo Co., Ltd., PGME/PGMEA=7/3 mixed solvent), a solvent used for photoresist solution, to evaluate their resistance to the solvent. Those which were undissolved and those which were dissolved were designated as ○ and x, respectively. The results are shown in Table 1.

[Photo-Curing Test]

Each of the protective film-forming compositions prepared in Examples 1, 2 and Comparative Examples 1 to 3 was applied onto a silicon wafer using a spinner. The resulting applied film was then baked on a hot plate at 100° C. for 1 minute to form a protective film (film thickness: 90 nm). These protective films were irradiated over the entire wafer surface with about 500 mJ/cm$^2$ of 172 nm wavelength light under a nitrogen atmosphere using a 172 nm light irradiation device SUS867 manufactured by USHIO Inc. These protective films were further immersed, for 1 minute, in OK73 thinner (manufactured by Tokyo Ohka Kogyo Co., Ltd., PGME/PGMEA=7/3 mixed solvent), a solvent used for photoresist solution, to evaluate their resistance to the solvent. Those which were undissolved and those which were dissolved were designated as ○ and x, respectively. The results are shown in Table 1.

[Optical Parameter Test]

Each of the protective film-forming compositions prepared in Examples 1, 2 and Comparative Example 1 was applied onto a silicon substrate using a spinner. The resulting applied film was then baked on a hot plate at 250° C. for 1 minute to form a protective film (film thickness: 90 nm). Each of the protective film-forming compositions prepared in Comparative Examples 2 and 3 was applied onto a silicon substrate using a spinner. The resulting applied film was then baked on a hot plate at 100° C. for 1 minute and irradiated over the entire wafer surface with about 500 mJ/cm$^2$ of 172 nm wavelength light under a nitrogen atmosphere using a 172 nm light irradiation device SUS867 to form a protective film (90 nm film thickness).

These protective films were then subjected to the measurement of the refractive index (n-value) and attenuation coefficient (k-value) at wavelengths of 193 nm and 248 nm using a spectroscopic ellipsometer (VUV-VASE VU-302, manufactured by J.A. Woollam Co.). The obtained results are shown in Table 1.

[Test for Resistance to a Basic Aqueous Hydrogen Peroxide Solution]

APM resistance of each of the protective film-forming compositions prepared in Examples 1, 2 and Comparative Examples 1 to 3 was assessed immediately after the preparation and after the storage of the solutions at 35° C. for one week.

Each of the protective film-forming compositions prepared in Examples 1, 2 and Comparative Example 1 was applied using a spinner onto a silicon substrate bearing a titanium nitride film formed on the surface. The resulting applied film was then baked on a hot plate at 250° C. for 1 minute to form a protective film (film thickness: 90 nm).

Each of the protective film-forming compositions prepared in Comparative Examples 2 and 3 was applied using a spinner onto a silicon substrate bearing a titanium nitride film formed on the surface. The resulting applied film was then baked on a hot plate at 100° C. for 1 minute and irradiated over the entire wafer surface with about 500 mJ/cm² of 172 nm wavelength light under a nitrogen atmosphere using a 172 nm light irradiation device SUS867 to form a protective film (90 nm film thickness).

The protective films made on the silicon substrate were then immersed in a basic aqueous hydrogen peroxide solution (abbreviated as APM in Table 1 below) of the composition shown in Table 2 below at a temperature shown in the same table, and the time until the protective film peeled off from the silicon substrate was measured to evaluate the APM resistance. The results are shown in Table 1. In Table 1. "○" indicates that no peeling of the resist underlayer film was observed when immersed for 10 minutes, and "x" indicates that peeling was observed in some or all of the resist underlayer film when immersed for 10 minutes.

TABLE 1

|  | Solvent resistance | | Optical parameter | | APM resistance | |
|---|---|---|---|---|---|---|
|  | | | 193 nm | 248 nm | Immediately after preparation | Stored at 35° C. for one week |
|  | Thermal curing | Photo curing | n value/k value | n value/k value | | |
| Example 1 | ○ | x | 1.45/0.55 | 1.89/0.05 | ○ | ○ |
| Example 2 | ○ | x | 1.45/0.66 | 1.89/0.05 | ○ | ○ |
| Comparative Example 1 | ○ | x | 1.46/0.55 | 1.87/0.06 | ○ | x |
| Comparative Example 2 | x | ○ | 1.70/0.07 | 1.61/0.03 | x | x |
| Comparative Example 3 | x | ○ | 1.70/0.03 | 1.59/0.00 | x | x |

TABLE 2

| 28% by mass aqueous ammonium solution | 33% by mass aqueous hydrogen peroxide solution | Water | Temperature |
|---|---|---|---|
| 30 mL | 30 mL | 60 mL | 50° C. |

The results in Table 1 above show that protective films made by the protective film-forming compositions prepared in Examples 1, 2 and Comparative Example 1 showed a solvent resistance to the resist solvent only by thermal curing. On the other hand, the protective films made by the protective film-forming compositions prepared in Comparative Examples 2 and 3 showed a solvent resistance to the resist solvent only by photo curing.

As shown in Table 1, the resins used in the protective film-forming compositions of the present invention showed a superior APM resistance than did the protective film-forming compositions prepared in Comparative Examples 2 and 3.

Moreover, the resins used in the protective film-forming compositions of the present invention showed a superior storage stability than did the protective film-forming composition prepared in Comparative Example 1. This is believed for the reason that the protective film-forming composition prepared in Comparative Example 1 had a poor storage stability and could not allow crosslinking to sufficiently progress to develop the APM resistance.

INDUSTRIAL APPLICABILITY

The protective film-forming composition of the present invention provides a protective film superior in resistance to a wet etching liquid to be applied in processing a substrate.

The invention claimed is:

1. A protective film-forming composition to a wet etching liquid for semiconductor, comprising
a polymer consisting of a unit structure represented by formula (1-1):

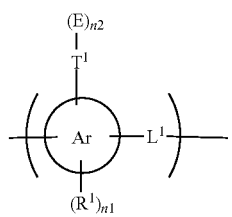

Formula (1-1)

wherein, Ar represents a benzene ring, a naphthalene ring or anthracene ring; $R^1$ represents a hydroxy group, a mercapto group which may be protected by a methyl group, an amino group which may be protected by a methyl group, a halogeno group or an alkyl group having 1 to 10 carbon atoms which may be substituted or interrupted by a heteroatom or substituted by a hydroxy group; n1 represents an integer of 0 to 3; n2 represents 1 or 2; $L^1$ represents a single bond or an alkylene group of 1 to 10 carbon atoms; E represents an epoxy group; when n2=1, $T^1$ represents a single bond or an alkylene group of 1 to 10 carbon atoms which may be interrupted by an ether bond, ester bond or amide bond; and when n2=2, $T^1$ represents a nitrogen atom or amide bond,
a thermal polymerization initiator, and
a solvent.

2. The protective film-forming composition to a wet etching liquid for semiconductor according to claim 1, wherein the $L^1$ is represented by formula (1-2):

$$—CR^2R^3—$$ Formula (1-2)

wherein, each of $R^2$ and $R^3$ independently represents a hydrogen atom, a methyl group, an ethyl group, an n-propyl group, an i-propyl group, a cyclopropyl group, an n-butyl group, an i-butyl group, an s-butyl group, a t-butyl group, a cyclobutyl group; and $R^2$ and $R^3$ bind to each other to form a ring of 3 to 6 carbon atoms).

3. The protective film-forming composition to a wet etching liquid for semiconductor according to claim 1, wherein the thermal polymerization initiator is a thermal cationic polymerization initiator.

4. The protective film-forming composition to a wet etching liquid for semiconductor according to claim 3, wherein the thermal cationic polymerization initiator is an onium salt compound.

5. The protective film-forming composition to a wet etching liquid for semiconductor according to claim 1, wherein the wet etching liquid for semiconductor comprises a hydrogen peroxide solution.

6. A protective film to a wet etching liquid for semiconductor, which is a baked product of an applied film of the protective film-forming composition according to claim 1.

7. A method for producing a substrate having a resist pattern comprising the steps of:
applying the protective film-forming composition according to claim 1 onto a semiconductor substrate and baking the applied composition to form a protective film as a resist underlayer film,
forming a resist film on the protective film, followed by exposure and development to form a resist pattern,
wherein the substrate having a resist pattern is for manufacturing a semiconductor.

8. A method for producing a semiconductor device comprising the steps of:
forming a protective film on a semiconductor substrate, optionally having an inorganic film formed on a surface thereof, using a protective film-forming composition that is protective to a wet etching liquid for semiconductor, the protective film-forming composition comprising
a polymer having a unit structure represented by formula (1-1):

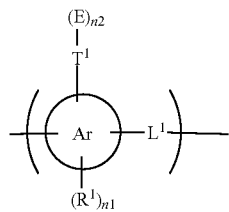

Formula (1-1)

wherein Ar represents a benzene ring, a naphthalene ring or anthracene ring; $R^1$ represents a hydroxy group, a mercapto group which may be protected by a methyl group, an amino group which may be protected by a methyl group, a halogeno group or an alkyl group having 1 to 10 carbon atoms which may be substituted or interrupted by a heteroatom or substituted by a hydroxy group; n1 represents an integer of 0 to 3; n2 represents 1 or 2; $L^1$ represents a single bond or an alkylene group of 1 to 10 carbon atoms; E represents an epoxy group; when n2=1, $T^1$ represents a single bond or an alkylene group of 1 to 10 carbon atoms which may be interrupted by an ether bond, ester bond or amide bond; and when n2-2, $T^1$ represents a nitrogen atom or amide bond, a thermal polymerization initiator, and a solvent;

forming a resist pattern on the protective film;

subjecting the protective film to dry etching using the resist pattern as a mask so as to expose a surface of the inorganic film or of the semiconductor substrate; and while using the dry-etched protective film as a mask, subjecting the inorganic film or the semiconductor substrate to wet etching and/or to washing using a wet etching liquid for semiconductor, wherein the wet etching liquid for semiconductor comprises a hydrogen peroxide solution.

\* \* \* \* \*